(12) United States Patent
Zierak et al.

(10) Patent No.: US 10,388,728 B1
(45) Date of Patent: Aug. 20, 2019

(54) STRUCTURES WITH AN AIRGAP AND METHODS OF FORMING SUCH STRUCTURES

(71) Applicant: GLOBALFOUNDRIES Inc., Grand Cayman (KY)

(72) Inventors: Michael Zierak, Colchester, VT (US); Anthony K. Stamper, Williston, VT (US); John J. Pekarik, Underhill, VT (US); Vibhor Jain, Essex Junction, VT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/911,831

(22) Filed: Mar. 5, 2018

(51) Int. Cl.
| | |
|---|---|
| *H01L 29/06* | (2006.01) |
| *H01L 23/48* | (2006.01) |
| *H01L 21/768* | (2006.01) |
| *H01L 21/762* | (2006.01) |
| *H01L 21/764* | (2006.01) |

(52) U.S. Cl.
CPC ........ *H01L 29/0649* (2013.01); *H01L 21/764* (2013.01); *H01L 21/76224* (2013.01); *H01L 21/76898* (2013.01); *H01L 23/481* (2013.01)

(58) Field of Classification Search
CPC ......... H01L 21/76289; H01L 21/76264; H01L 29/0649
See application file for complete search history.

(56) References Cited

U.S. PATENT DOCUMENTS

| | | | |
|---|---|---|---|
| 7,427,803 B2 | 9/2008 | Chao et al. | |
| 8,674,472 B2 | 3/2014 | Botula et al. | |
| 9,048,284 B2 | 6/2015 | McPartlin et al. | |
| 9,349,793 B2 | 5/2016 | Jaffe et al. | |
| 2005/0020085 A1* | 1/2005 | Lee | H01L 21/7624 438/700 |
| 2008/0217653 A1* | 9/2008 | Sonsky | H01L 21/76264 257/190 |
| 2008/0303090 A1 | 12/2008 | Ieong et al. | |
| 2014/0264635 A1* | 9/2014 | Chen | H01L 29/7833 257/408 |

(Continued)

OTHER PUBLICATIONS

Loubet et al., "Selective etching of Si1—xGex versus Si with gaseous HCI for the formation of advanced CMOS devices", Thin Solid Films 517 (2008) 93-97.

(Continued)

*Primary Examiner* — Charles D Garber
*Assistant Examiner* — Alia Sabur
(74) *Attorney, Agent, or Firm* — Thompson Hine LLP

(57) ABSTRACT

Structures that include an airgap and methods for forming a structure that includes an airgap. A layer stack is epitaxially grown on a substrate and includes a first semiconductor layer and a second semiconductor layer on a substrate. A plurality of openings are formed that extend through a device region of the first semiconductor layer to the second semiconductor layer. The second semiconductor layer is etched through the openings and selective to the substrate and the first semiconductor layer so as to form an airgap that is arranged in a vertical direction between the substrate and the device region. A device structure is formed in the device region of the first semiconductor layer.

12 Claims, 3 Drawing Sheets

(56) References Cited

U.S. PATENT DOCUMENTS

| | | | |
|---|---|---|---|
| 2015/0145043 A1* | 5/2015 | Huang | H01L 27/1203 257/347 |
| 2015/0187751 A1* | 7/2015 | Quaglietta | H01L 27/0248 257/491 |
| 2015/0194416 A1 | 7/2015 | Cheng et al. | |
| 2016/0071925 A1* | 3/2016 | Jaffe | H01L 29/0649 257/347 |
| 2018/0083098 A1* | 3/2018 | Goktepeli | H01L 29/0649 |

OTHER PUBLICATIONS

Hashimoto, et al., "A Study on Suppressing Crosstalk Through a Thick SOI Substrate and Deep Trench Isolation", IEEE Journal of the Electron Devices Society, vol. 1, No. 7, Jul. 2013.

Ohguro, et al., "High performance digital-analog mixed device on a Si substrate with resistivity beyond 1 kQ cm", International Electron Devices Meeting Technical Digest, 2000.

* cited by examiner

US 10,388,728 B1

STRUCTURES WITH AN AIRGAP AND METHODS OF FORMING SUCH STRUCTURES

BACKGROUND

The present invention relates to semiconductor device fabrication and integrated circuits and, more specifically, to structures that include an airgap and methods for forming a structure that includes an airgap.

Complementary metal-oxide semiconductor (CMOS) circuitry is utilized in mobile communication devices (e.g., laptops, cellular phones, tablets, etc.) to handle wireless high frequency signals transmitted to and/or received by the mobile communication devices. The circuitry may include a low noise amplifier and a high frequency switch that allows for high frequency signals received by an antenna to be routed from the low noise amplifier to other chip circuitry and for high frequency signals to be routed from a power amplifier to the antenna. The high frequency switch may include a stack or bank of field-effect transistors formed by CMOS processes. Field-effect transistors fabricated on a bulk substrate may exhibit poor linearity due to, for example, non-linear electric fields on the substrate and poor intermodulation properties. Semiconductor-on-insulator (SOI) substrates may mitigate these issues, but are costly in comparison with bulk substrates.

Improved structures that include an airgap and methods for forming such structures are needed.

SUMMARY

In an embodiment of the invention, a structure includes a substrate and a first semiconductor layer on the substrate. The first semiconductor layer includes a device region, and a device structure is located in the device region. An airgap is arranged in a vertical direction between the substrate and the device region. The semiconductor layer includes a plurality of openings that extend through the device region to the airgap.

In an embodiment of the invention, a method includes epitaxially growing a layer stack including a first semiconductor layer and a second semiconductor layer on a substrate. The method further includes forming a plurality of openings extending through a device region of the first semiconductor layer to the second semiconductor layer, and etching the second semiconductor layer through the openings and selective to the substrate and the first semiconductor layer so as to form an airgap that is arranged in a vertical direction between the substrate and the device region. A device structure is formed in the device region of the first semiconductor layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
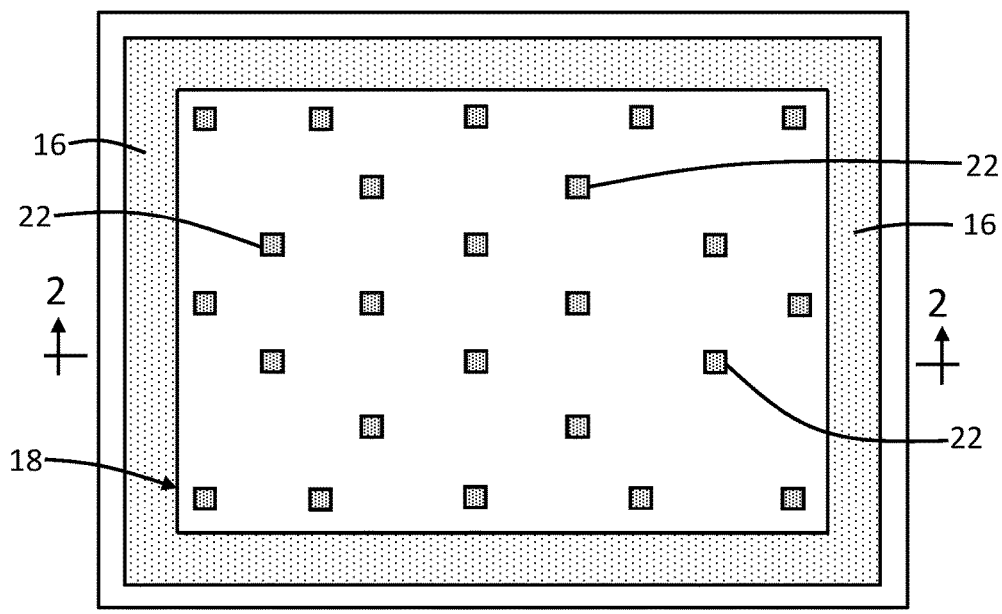
FIG. 1 is a top view of a structure at an initial fabrication stage of a processing method in accordance with an embodiment of the invention.
Figure 2:
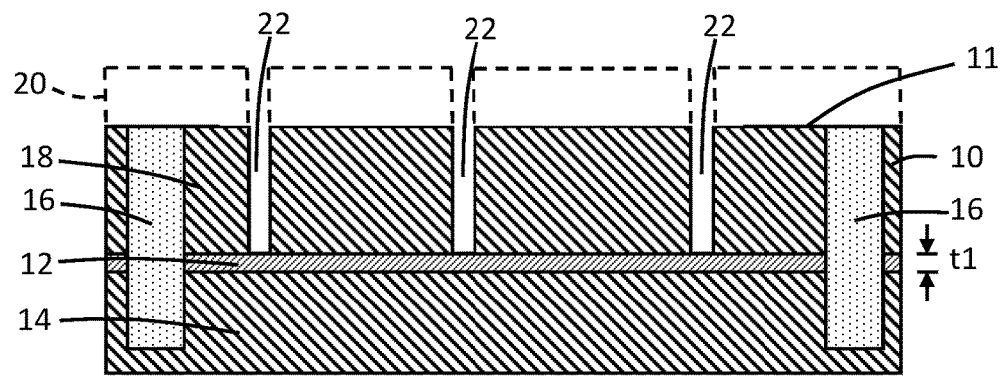
FIG. 2 is a cross-sectional view taken generally along line 2-2 in FIG. 1.

With reference to FIGS. 1, 2 and in accordance with embodiments of the invention, a semiconductor layer 10 usable to form the devices of an integrated circuit with front-end-of-line (FEOL) processing and a semiconductor layer 12 are formed on a substrate 14. The semiconductor layer 10 may be composed of single-crystal silicon. The substrate 14 may be a bulk wafer comprised of single-crystal silicon. In an embodiment, the substrate 14 may be a high-resistivity bulk silicon wafer having a resistivity greater than or equal to 1 kOhm-cm. The semiconductor layer 12 is epitaxially grown over the substrate 14 using the substrate 14 as a growth seed, and the semiconductor layer 10 is epitaxially grown over the semiconductor layer 12 using the semiconductor layer 12 as a growth seed.

The semiconductor layer 12 may be composed of a material, such as silicon-germanium (SiGe), that can be etched selective to the semiconductor material (e.g., silicon) of the semiconductor layer 10 and to the semiconductor material of the substrate 14 (e.g., silicon). As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. In an embodiment, the semiconductor layer 12 may be composed of silicon-germanium with a germanium content ranging from twenty percent (20%) to thirty-five percent (35%), which etches at a higher rate than silicon. In an embodiment, the semiconductor layer 12 may have a thickness, t1, that is less than or equal to 50 nanometers. In an embodiment, the semiconductor layer 10 may have a thickness that is less than or equal to 500 nanometers such that a top surface of the semiconductor layer 12 is spaced from the top surface 11 of the semiconductor layer 10 by a distance that is less than or equal to 500 nanometers.

Deep trench isolation regions 16 are formed that extend from the top surface 11 of the semiconductor layer 10 through the semiconductor layer 10 and the semiconductor layer 12 and penetrate to a shallow depth into the substrate 14. The deep trench isolation regions 16 surround a section of the semiconductor layer 10 to define a device region 18 that may be used in front-end-of-line (FEOL) device fabrication. The top surface of the device region 18 coincides with the top surface 11 of the semiconductor layer 10. The deep trench isolation regions 16 may be formed by etching trenches and then filling the etched trenches with a dielectric material, such as silicon dioxide ($SiO_2$), that is deposited (e.g., by chemical vapor deposition (CVD)) and planarized with, for example, chemical mechanical polishing (CMP).

An etch mask 20, shown in dashed lines, is formed over the top surface 11 of the semiconductor layer 10 and deep trench isolation regions 16, and is arranged to cover the device region 18. The etch mask 20 may include a photoresist that is applied as a coating by a spin coating process, pre-baked, exposed to light projected through a photomask, baked after exposure, and developed with a chemical developer to form openings. A directional etching process, such as reactive ion etching (ME), is used to form openings 22 at the locations of the openings in the etch mask 20. The openings 22 penetrate completely through the semiconductor layer 10 to the semiconductor layer 12. The etching process may remove the material of the semiconductor layer 10 selective to the material of the semiconductor layer 12 such that the semiconductor layer 12 functions as an etch stop.

The openings 22 may be arranged in an array or another pattern across the top surface 11 of the device region 18, or the arrangement of the openings 22 may be placed in random positions. The number and size of the openings 22 may also vary depending on design parameters. In the representative embodiment, the openings 22 terminate at the top surface of the semiconductor layer 12. In alternative embodiments, the openings 22 may penetrate partially through the semiconductor layer 12. In alternative embodiments, the openings 22 may penetrate completely through the semiconductor layer 12. In alternative embodiments, the openings 22 may penetrate completely through the semiconductor layer 12 and into the underlying substrate 14.

Figure 3:
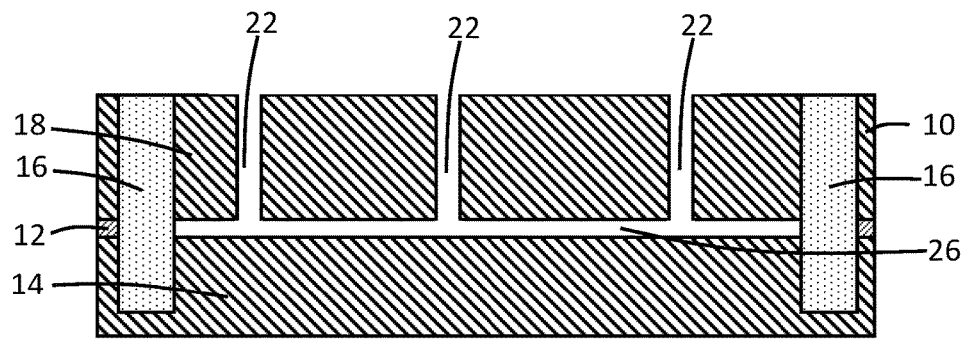
FIGS. 3-5 are cross-sectional views of the structure at successive fabrication stages subsequent to FIG. 2.

With reference to FIG. 3 in which like reference numerals refer to like features in FIGS. 1, 2 and at a subsequent fabrication stage, an airgap 26 is formed that extends beneath the device region 18 and that is arranged vertically between the device region 18 of the semiconductor layer 10 and the substrate 14. To that end, the semiconductor layer 12 may be completely removed from beneath the device region 18 with an isotropic etching process that etches the material constituting the semiconductor layer 12 selective to the materials constituting the semiconductor layer 10, substrate 14, and the deep trench isolation regions 16. The airgap 26 may have a height equal to the thickness of the semiconductor layer 12. The openings 22 in the semiconductor layer 10 provide ingress and egress pathways for the etchant removing the semiconductor layer 12. The isotropic etching process includes a lateral etching component that etches the sacrificial layer starting at the locus of each opening 22 and expanding outwardly until the individual etched volumes merge together to form the airgap 26. Until merger occurs, the individual unetched volumes of the solid material of the semiconductor layer 12 between the individual etched volumes provide support for the device region 18. The semiconductor layer 12 may be etched and removed using, for example, hot ammonia (NH3) and/or hydrochloric acid (HCl) vapor.

The airgap 26 may be characterized by a permittivity or dielectric constant of near unity (i.e., vacuum permittivity). The airgap 26 may be filled by atmospheric air at or near atmospheric pressure, may be filled by another gas at or near atmospheric pressure, or may contain atmospheric air or another gas at a sub-atmospheric pressure (e.g., a partial vacuum). The reduced dielectric constant of the airgap 26 reduces the capacitive coupling between device structures formed in the device region 18 and the substrate 14.

The deep trench isolation regions 16 define a boundary over which the semiconductor layer 12 is removed and surround the airgap 26 on all sides. The device region 18 is attached to the deep trench isolation regions 16 about its entire perimeter. The deep trench isolation regions 16 surrounding the device region 18 apply an inward compressive stress on the device region 18 at the sidewall of the device region 18. The inward compressive stress, which may cause the device region 18 to bow upward, physically and structurally supports the device region 18 and prevents its collapse after the airgap 26 is formed. The semiconductor layer 12 outside of the deep trench isolation regions 16 is not removed and also surrounds the airgap 26 on all sides.

Figure 4:
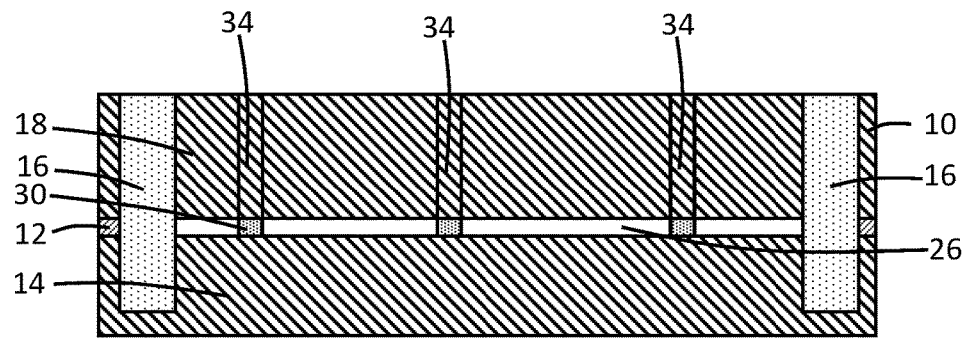

With reference to FIG. 4 in which like reference numerals refer to like features in FIG. 3 and at a subsequent fabrication stage, pillars 30 of a dielectric material may be formed inside the airgap 26 below each of the openings 22. The dielectric material may be composed of, for example, aluminum oxide ($Al_2O_3$) or silicon dioxide ($SiO_2$) deposited by atomic layer deposition (ALD) or a rapid thermal oxide (RTO). The deposited dielectric material increases in height as the deposition progresses. The dielectric material pillars 30 are arranged in the airgap 26 with the same arrangement as the openings 22 in the device region 18. The height of the dielectric material pillars 30 may be greater than or equal to the height of the airgap 26 so that the dielectric material pillars 30 assist with physically and structurally supporting the device region 18 above the airgap 26. The dielectric material pillars 30 are optional features and, in an alternative embodiment, the dielectric material pillars 30 may be omitted from the structure.

The openings 22 may be at least partially filled with plugs 34 composed of a semiconductor material such that the device region 18 is unbroken. In an embodiment, the semiconductor material plugs 34 may be composed of an epitaxially-grown semiconductor material, such as silicon, that pinches off to seal and occlude the openings 22. The semiconductor material constituting the plugs 34 may be the same as the semiconductor material constituting the semiconductor layer 10.

Figure 5:
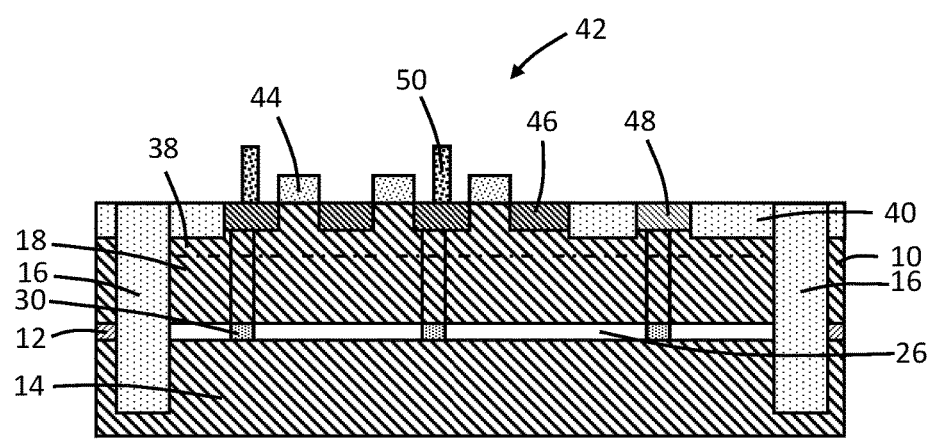

With reference to FIG. 5 in which like reference numerals refer to like features in FIG. 4 and at a subsequent fabrication stage, a well 38 is formed in the upper section of the device region 18 above the airgap 26 by, for example, ion implantation. Shallow trench isolation regions 40 are formed that penetrate to a shallow depth into the device region 18. The shallow trench isolation regions 40 may be composed of a dielectric material, such as an oxide of silicon (e.g., silicon dioxide ($SiO_2$)), deposited by chemical vapor deposition (CVD) into trenches etched by a masked etching process in the device region 18.

A device structure, generally indicated by reference numeral 42, may be formed by front-end-of-line (FEOL) processing using the device region 18. For example, the device structure 42 may be a switch field-effect transistor that includes multiple gate fingers 44 having a parallel arrangement in rows and connected together at one end. Each gate finger 44 may include a gate electrode and a gate dielectric formed by depositing a layer stack and patterning the layer stack with photolithography and etching. The gate electrode may be composed of a conductor, such as doped polycrystalline silicon (i.e., polysilicon), and the gate dielectric may be composed of an electrical insulator, such as silicon dioxide ($SiO_2$). The device structure 42 may include other elements such as source/drain regions 46, halo regions, and lightly doped drain (LDD) extensions, as well as non-conductive spacers (not shown) formed on the vertical sidewalls of the gate fingers 44 and a body contact 48 coupled with the well 38. The source/drain regions 46 may be doped with an n-type dopant (e.g., arsenic (As) or phosphorus (P)) selected from Group V of the Periodic Table to produce n-type conductivity, and the well 38 and body contact 48 may be implanted with ions of a p-type dopant (e.g., boron B)) selected from Group III of the Periodic Table to produce p-type conductivity.

Other types of active device structures may be formed in the device region, such as laterally-diffused metal-oxide-semiconductor (LDMOS) devices, bipolar junction transistors or heterojunction bipolar transistors, etc. In addition, passive device structures may be formed in the device region 18 in addition to the active device structures or instead of the active device structures.

Middle-of-line (MOL) and back-end-of-line (BEOL) processing follow, which includes formation of contacts 50 in an interlayer dielectric layer that extend to the source/drain regions 46. The filling of the openings 22 (FIG. 3) with the plugs 34 (FIG. 4) provides source/drain regions 46 that are solid and unbroken such that the contacts 50 can land on the source/drain regions 46 at the former locations of the openings 22.

Figure 6:
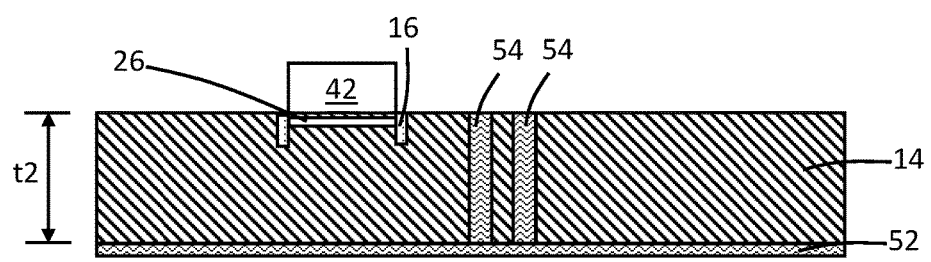
FIG. 6 is a cross-sectional view of a chip that includes the structure of FIG. 5.

With reference to FIG. 6 in which like reference numerals refer to like features in FIG. 5 and in embodiments of the invention, the airgap 26 may be used in conjunction with a substrate 14 that has a thickness, t2, less than or equal to 100 microns and that includes through-silicon vias 54 extending through the semiconductor layers 10, 12 and substrate 14 to a metal layer 52. The through-silicon vias 54 provide vertical electrical connections that pass through the semiconductor layers 10, 12 and substrate 14 to establish electrical connections from one side (i.e., a front side) to an opposite side (i.e., a back side). The through-silicon vias 54 may be fabricated by etching via openings that penetrate through the semiconductor layers 10, 12 and substrate 14, filling the resulting via openings with a conductor, and performing a back side reveal process. The metal layer 52 may be deposited on the back side of the substrate 14 after the through-silicon vias 54 are fabricated. During the operation of the device structure 42, the airgap 26 prevents the substrate 14 from being fully depleted across its entire thickness and thereby reduces leakage current. The airgap 26 may reduce the limitations on the resistivity of the substrate 14 such that higher substrate resistivities are achievable without affecting device operation.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product. For example, the field-effect transistor and/or handle wafer contact in the embodiments described herein may be used in a switch, a low noise amplifier, or a logic circuit.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a substrate;
   a first semiconductor layer on the substrate, the first semiconductor layer including a device region;
   a device structure in the device region;
   an airgap arranged in a vertical direction between the substrate and the device region, the airgap having a first height in the vertical direction;
   a plurality of dielectric pillars arranged in the airgap; and
   a plurality of plugs comprised of a semiconductor material,
   wherein the first semiconductor layer includes a plurality of openings that extend through the device region to the airgap, the dielectric pillars are respectively aligned with the openings, the dielectric pillars having a second height that is greater than or equal to the first height of the airgap, and the plugs are respectively arranged to at least partially fill the openings over the dielectric pillars.

2. The structure of claim 1 further comprising:
   a plurality of deep trench isolation regions surrounding the device region.

3. The structure of claim 1 wherein the airgap has a height in the vertical direction that is less than or equal to 50 nanometers.

4. The structure of claim 1 wherein the device region has a top surface, and the airgap is spaced in the vertical direction from the top surface of the device region by a distance that is less than or equal to 500 nanometers.

5. The structure of claim 1 further comprising:
   a second semiconductor layer arranged in the vertical direction between the substrate and the first semiconductor layer, the second semiconductor layer arranged in a horizontal direction to surround the airgap.

6. The structure of claim 5 further comprising:
   a plurality of deep trench isolation regions surrounding the device region and the airgap, the deep trench isolation regions arranged in the horizontal direction between the airgap and the second semiconductor layer.

7. The structure of claim 1 wherein the substrate has a resistivity greater than or equal to 1 kOhm-cm.

8. The structure of claim 7 wherein the first semiconductor layer and the airgap are located on a first side of the substrate, and further comprising:
   a metal layer on a second side of the substrate; and
   a plurality of through-silicon vias extending from the first side of the substrate to the metal layer on the second side of the substrate.

9. The structure of claim 1 wherein the device structure is a switch field-effect transistor.

10. The structure of claim 1 wherein the device structure is a field-effect transistor, and further comprising:
    a source/drain region of the field-effect transistor in the device region, wherein the source/drain region is arranged in part over one or more of the plugs in the openings.

11. The structure of claim 1 wherein the openings are arranged in an array.

12. The structure of claim 1 wherein the openings are arranged with random positions.

* * * * *